United States Patent [19]

Skinner

[11] Patent Number: 4,966,763
[45] Date of Patent: Oct. 30, 1990

[54] DIRECT VAPOR/SOLID SYNTHESIS OF MERCURIC IODIDE USING COMPOUNDS OF MERCURY AND IODINE

[75] Inventor: Nathan L. Skinner, Carpinteria, Calif.

[73] Assignee: The United States of America as represented by the Department of Energy, Washington, D.C.

[21] Appl. No.: 384,197

[22] Filed: Jul. 24, 1989

[51] Int. Cl.$^5$ ............................................. C01G 13/04
[52] U.S. Cl. ..................................... 423/491; 423/107
[58] Field of Search ....................... 423/491, 107, 210

[56] References Cited

U.S. PATENT DOCUMENTS

| 3,704,875 | 12/1972 | Waltrich | 266/15 |
|---|---|---|---|
| 3,849,537 | 11/1974 | Allgulin | 423/210 |
| 3,981,967 | 9/1976 | Maiwald et al. | 423/491 |
| 4,030,964 | 6/1977 | Schieber et al. | 156/610 |
| 4,196,173 | 4/1980 | de Jong et al. | 423/210 |
| 4,282,057 | 8/1981 | Faile | 423/491 |
| 4,642,142 | 2/1987 | Harman | 156/601 |

OTHER PUBLICATIONS

Bailar et al., *Comprehensive Inorganic Chemistry*, Pergamon Press, 1973, pp. 296-304.

Primary Examiner—Jeffrey E. Russel
Assistant Examiner—Stephen G. Kalinchak
Attorney, Agent, or Firm—L. E. Carnahan; Roger S. Gaither; William R. Moser

[57] ABSTRACT

A process is disclosed for producing high purity mercuric iodide by passing a gaseous source of a mercuric compound through a particulate bed of a low vapor pressure iodide compound which is maintained at an elevated temperature which is the lower of either: (a) just below the melting or volatilization temperature of the iodide compound (which ever is lower); or (b) just below the volatilization point of the other reaction product formed during the reaction; to cause the mercuric compound to react with the iodide compound to form mercuric iodide which then passes as a vapor out of the bed into a cooler condensation region.

23 Claims, 2 Drawing Sheets

DIRECT VAPOR/SOLID SYNTHESIS OF MERCURIC IODIDE USING COMPOUNDS OF MERCURY AND IODINE

BACKGROUND OF THE INVENTION

The invention described herein arose in the course of, or under, Contract No. DE-AC08-83NV10282 between the United States Department of Energy and EG&G Energy Measurements, Incorporated.

This invention relates to a process for producing high purity mercuric iodide. More particularly, this invention relates to a process for producing high purity mercuric iodide by passing a vapor of a mercuric compound through a low vapor pressure particulate bed of an iodide compound to form mercuric iodide.

High purity mercuric iodide ($HgI_2$) is valuable as an ambient temperature radiation detector for electromagnetic radiation ranging from visible light up through x-ray and gamma ray wavelengths. When crystal quality is high enough, $HgI_2$ may be used in the manufacture of spectrometers. However, high quality crystals require extremely pure $HgI_2$.

Schieber et al U.S. Pat. No. 4,030,964 teaches the production of $HgI_2$ crystals by vapor phase growth in a two stage horizontal furnace wherein purified $HgI_2$ material is placed into one end of an ampoule and sublimed in one zone of the furnace and then grown as a crystal in an opposite end of the ampoule located in a second cooler zone of the furnace. However, the patentees require a purified $HgI_2$ as a starting material.

It is also known to grow $HgI_2$ with electrical properties suitable for use as nuclear radiation detectors by a chemical transport method using organic materials. Faile U.S. Pat. No. 4,282,057 describes such a method for producing a low temperature red form of mercuric iodide using styrene, polyethylene, or a CN-containing reagent such as $NH_4SCN$ or $Hg(SCN)_2$. Mercuric iodide and the reagent are placed in one end of a sealed evacuated tube which is then heated while the other end of the tube is maintained at room temperature resulting in the growth of mercuric iodide platelets at the cooler end of the tube.

However, hydrocarbons appear to be one of the worst contaminants to remove from $HgI_2$ when it is desired to provide the high purity $HgI_2$ needed for high quality crystals. It would, therefore, be desirable to provide a process for the production of high purity $HgI_2$ without the necessity of removing hydrocarbons from the $HgI_2$ to achieve such purity.

SUMMARY OF THE INVENTION

It is, therefore, an object of this invention to provide a process for producing high purity $HgI_2$ without the need for subsequent purification to remove hydrocarbons or other contaminants.

It is another object of this invention to provide a process for producing high purity $HgI_2$ by passing a gaseous mercuric compound through a heated bed of a low vapor pressure iodide compound to cause the gaseous mercuric compound to react with the iodide compound to form $HgI_2$.

It is yet another object of this invention to provide a process for producing high purity $HgI_2$ by passing a gaseous mercuric compound through a particulate bed of a low vapor pressure iodide compound heated to a temperature of up to the lower of: (a) just below the melting or volatilization temperature of the particulate iodide compound (which ever is lower); or (b) just below the volatilization temperature of the other reaction product formed during the reaction; to cause the gaseous mercuric compound to react with the iodide compound to form $HgI_2$.

These and other objects of the invention will be apparent from the following description and accompanying drawings.

DETAILED DESCRIPTION OF THE INVENTION

Figure 1:
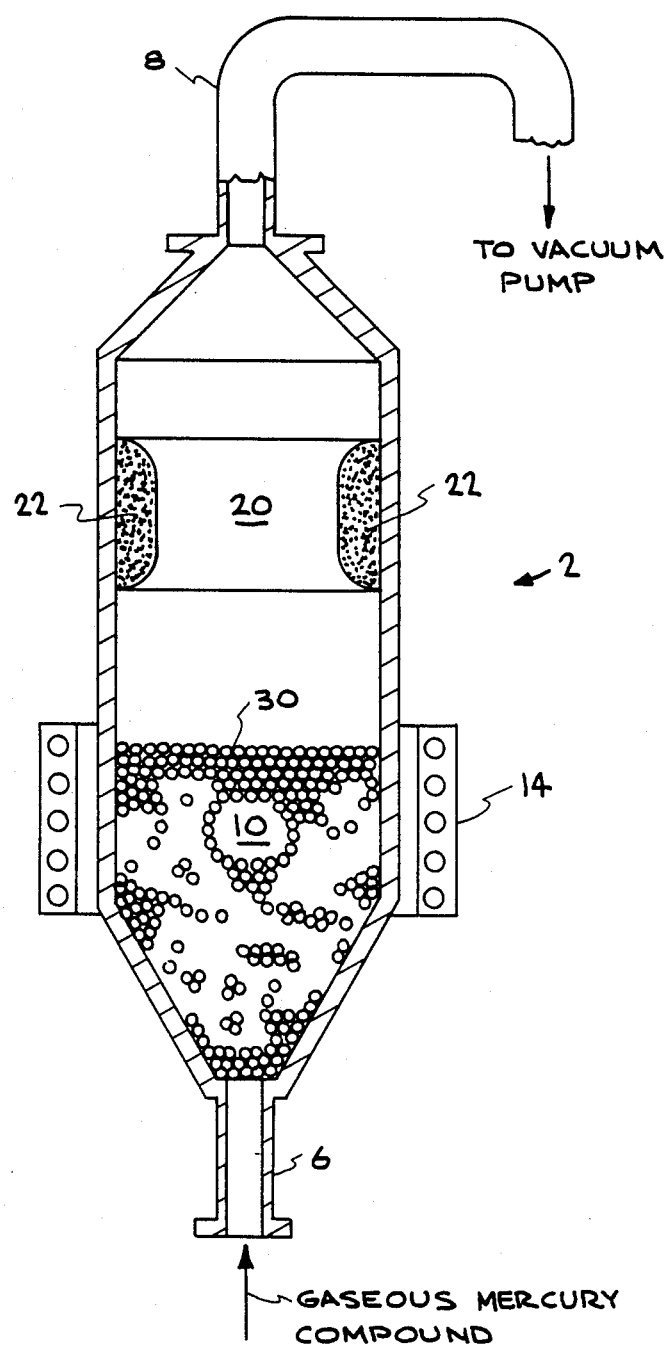
FIG. 1 is a vertical cross section view of an apparatus which may be used in the practice of the process of the invention.
Figure 2:
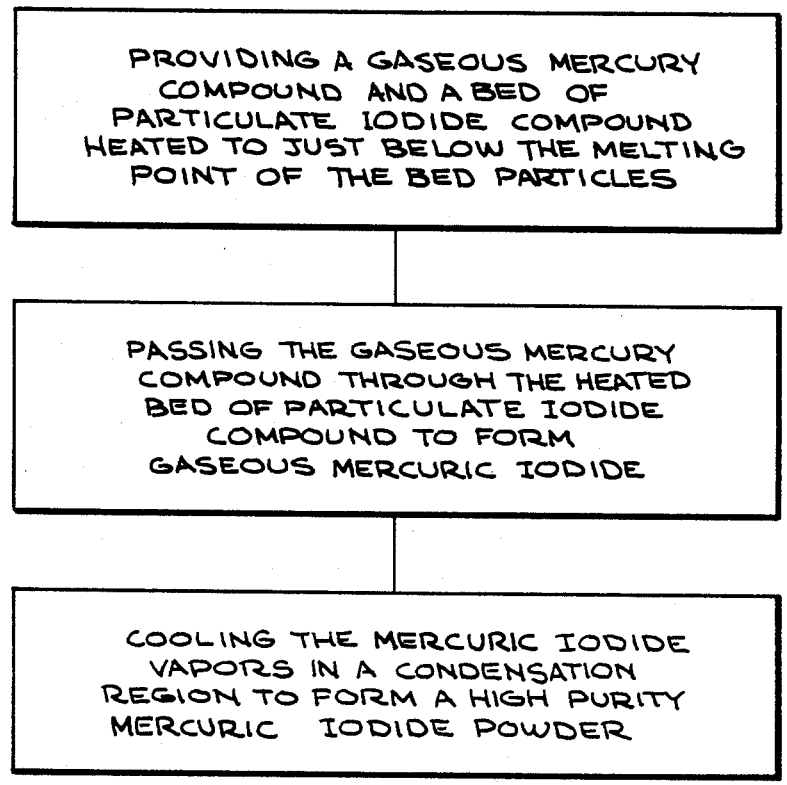
FIG. 2 is a flow sheet describing the process of the invention.

The invention provides a method for producing high purity mercuric iodide ($HgI_2$) by reaction of a gaseous mercuric compound with an iodide compound in particulate form by passing the gaseous mercuric compound through the particulate bed while maintaining the bed at an elevated temperature up to the lower of either: (a) just below the melting temperature or volatilization temperature of the iodide compound (which ever is lower); or (b) just below the volatilization temperature of the other reaction product formed during the reaction.

By a "high purity" mercuric iodide reaction product is meant a mercuric iodide reaction product having a purity of at least 99.90%, and higher than the starting reactants, and having an organic content of less than about 5 ppm.

The mercuric compound may comprise any inorganic compound of mercury which will volatilize under vacuum at any temperature from room temperature up to the melting point of the iodide compound. By "vacuum" is meant any pressure below atmospheric pressure. Examples of mercuric compounds which may be used in the process of this invention, depending upon the melting point of the particular iodide compound selected, include mercuric fluoride [$HgF_2$], mercuric chloride [$HgCl_2$], mercuric bromide [$HgBr_2$], mercuric chloride iodide [$HgClI$], mercuric nitrate [$Hg(NO_3)_2$], mercuric oxide [$HgO$], mercuric sulfate [$HgSO_4$], mercuric subsulfate [$HgSO_4.2HgO$], and mercuric sulfide [$HgS$].

Both the mercury compound used to form the gaseous mercury compound reactant and the particulate iodide compound should be at least reagent grade materials and preferably are high purity compounds. By the term "high purity" in this context is meant a reactant having a purity of at least 99.99 wt. %.

The mercury compound is heated, while maintaining a vacuum in the reactor, as measured at the exit of the reactor attached to the mercuric source, of from about $10^{-1}$ to about $10^{-4}$ Torr. The mercuric compound is heated to a temperature of from about 80° C. to about 150° C. to volatilize it and the vapor is then introduced into a reactor containing a bed of a particulated iodide compound which preferably has been preheated as will be explained below.

The gaseous mercuric compound is passed, in undiluted form, i.e., without a carrier gas, through the heated bed of particulate iodide compound at a rate which may vary from about 0.01 to about 0.2 cm$^3$/minute/cm$^3$ of bed volume to provide a sufficient residence time in the bed to permit a reaction time which may vary from as short as 1 second up to 60 seconds, preferably at least about 10 seconds.

The iodide compound may comprise any compound which has a melting point above the bed temperature, which is capable of reacting with the gaseous mercuric compound to form mercuric iodide, and which will form another reaction product which will not volatilize at the reaction temperature and pressure.

Examples of suitable iodide compounds which may be used in particle form as the second reactant include alkali metal iodides such as LiI, NaI, KI, RbI, and CsI; alkaline earth metal iodides such as MgI$_2$, CaI$_2$, SrI$_2$, and BaI$_2$. Other metal iodides which may be used in the practice of the invention include BeI$_2$, AlI$_3$, TiI$_2$, CrI$_2$, MnI$_2$, FeI$_2$, CoI$_2$, NiI$_2$, CuI, ZnI$_2$, GaI$_3$, YI$_3$, ZrI$_4$, AgI, CdI$_2$, InI$_3$, SmI$_2$, etc.

The iodide compound is used in particle form having a particle size ranging from about 4 to about 300 mesh (Tyler), preferably from about 20 to about 100 mesh (Tyler).

The particle bed of iodide compound is heated to a temperature of from about 150° C. up to either: (a) just below the melting point of the particulated iodide compound, i.e., up to within 10° C. of the melting or volatilization point (which ever is lower), preferably within a temperature range of from about 150° to about 700° C., and most preferably within a temperature range of from about 200° to about 600° C.; or (b) up to just below the volatilization temperature of the other reaction product formed during the reaction; whichever temperature is lower. The reactor is maintained at a vacuum of from about 10$^{-1}$ to about 10$^{-4}$ Torr during the reaction, including the heating of the particle bed.

By a temperature of "up to just below" the melting point of the particulated iodide compound or "up to just below" the volatilization point of the other reaction product formed during the reaction is meant a temperature of not higher than about 10° C. below the particular melting point or volatilization temperature to ensure that the vapors of mercuric iodide reaction product are not contaminated with vapors of either the particulate iodide compound or the other reaction product.

In this regard it should be noted that while the temperature of the bed must be lower than the volatilization temperature of the other reaction product, it may be higher than the melting point of the other reaction product, in which case the other reaction product will be in a liquid state in the reactor. Under such conditions, the reaction could be carried out on a continuous basis rather than as a batch reaction with the other reaction product continuously drained from the reactor as a liquid.

With respect to both the operating temperature of the bed and the purity of the reactants used to form the high purity mercuric iodide product, part of the reason that the mercuric iodide product will be of even higher purity than the reactants is that non-volatile impurities will remain in the bed while highly volatile impurities will be volatilized and pass out of the reactor without condensing. Furthermore, with respect to organic impurities, operating the particulate bed of iodide reactant at a temperature of at least 500° C. will result not only in volatilization of the organics but will also result in cracking of higher boiling organics with elemental carbon residues then remaining in the bed while the by-products of the cracking leave the reactor as gases resulting in a high purity mercuric iodide product having a much lower content of organic impurities than that of the prior art.

As the gaseous mercury compound passes through the heated bed of particulate iodide compound, the mercuric compound and the iodide compound react to form gaseous mercuric iodide and another reaction product which, as previously discussed, should have a sufficiently low vapor pressure at the reaction temperature and pressure so that only vapors of mercuric iodide pass out of the zone of the reactor containing the heated bed of particulate iodide compound.

The vapors of mercuric iodide pass out of the first zone of the reactor containing the bed of particulate iodide compound into a second, cooler, zone in the reactor which may be maintained at a temperature of from about 25° to 75° C., preferably about 30° to 60° C., where the mercuric iodide vapors are condensed and collected as a crystalline powder or mass.

When the reaction is carried out at a temperature at which the other reaction product forms as a solid, the other reaction product will accumulate in the reaction bed. Whether the other reaction product is a liquid or solid at the operating temperature and pressure of the reaction, the bed must eventually be discarded when substantially all of the iodide compound in the bed has been reacted with the mercuric compound to form the desired mercuric iodide product. The time for discard of the bed can be calculated based on how much mercuric iodide has been made, relative to the amount of iodide compound initially present in the bed.

Referring now to FIG. 1, by way of example only, a reactor is generally indicated at 2 comprising a first zone 10 which may be heated by external heating coils 14 up to the desired reaction temperature which, as previously discussed, may extend up to slightly below the melting temperature of a particulate iodide compound 30 which comprises the particle bed in zone 10 of reactor 2, or to slightly below the volatilization temperature of the other reaction product, under the vacuum conditions present in the reactor, which ever is lower. Reactor 2 is depicted in the drawing as a vertically disposed reactor, but it will be understood that the reactor made also be disposed horizontally as well by providing a restraint for the particle bed.

Reactor 2 is further provided with an inlet port 6 through which is admitted a heated gaseous mercuric compound which then flows through particulate bed 30 of iodide compound in reactor 2. The gaseous mercuric compound, upon contacting the heated iodide compound particles of bed 30, reacts with the iodide compound to form mercuric iodide in gaseous form which then flows out of bed 30 in heated zone 10 of reactor 2 into the cooler second zone 20 of reactor 2 where the mercuric iodide vapors condense on the walls of the cooler zone 20 of reactor 2, as shown at 22, resulting in the formation of high purity mercuric iodide crystals. An evacuation system, such as a vacuum pump (not shown), is connected to reactor 2 through exit port 8.

To further illustrate the invention, 99.5% purity mercuric chloride was sublimed at a temperature of approximately 125° C. and passed through reactor containing, in a first heated zone, a bed of 99.0% purity potassium iodide particles having a particle size range of 20 to 40 mesh (Tyler) and heated to a temperature of from about 200° to 600° C. with a pressure of about 0.1 torr. The gaseous mercuric chloride reacted with the particulate potassium iodide to form the desired high purity mercuric iodide product as well as a potassium chloride second reaction product according to the formula:

$$HgCl_2 + 2KI \rightarrow 2KCl + HgI_2$$

Neither the particulate KI used in the bed nor the KCl second reaction product formed in the bed had sufficient vapor pressure at these temperatures to volatilize out of the hot zone. However, the $HgI_2$ vapors passed out of the hot zone of the reactor containing the heated particle bed into a cooler zone of the reactor maintained at a temperature of from about 30° to 60° C. where the mercuric iodide condensed. 220 grams of mercuric iodide powder was collected having a purity of 99.95%.

Thus, the process of the invention provides a method for forming high purity mercuric iodide by reacting a gaseous mercury compound with a heated particulate iodide compound in a first heated zone to form a gaseous mercuric iodide reaction product which may be condensed in a cooler zone to recover the mercuric iodide product.

While a specific embodiment of the process and apparatus for forming high purity mercuric iodide has been illustrated and described for carrying out the process in accordance with this invention, modifications and changes of the apparatus, parameters, materials, etc. will become apparent to those skilled in the art, and it is intended to cover in the appended claims all such modifications and changes which come within the scope of the invention.

What is claimed is:

1. A process for producing high purity mercuric iodide which comprises:
   (a) providing a gaseous source of a mercuric compound;
   (b) providing a particulate bed of an iodide compound;
   (c) passing said gaseous source of said mercuric compound through said bed to cause said mercuric compound to react with said iodide compound to form a mercuric iodide vapor reactor product;
   (d) flowing said mercuric iodide vapor reaction product from said bed to a separate condensation region; and
   (e) condensing the resultant mercuric iodide vapor reactor product from said particulate bed in said separate condensation region.

2. The process of claim 1 wherein said particulate iodide compound is heated to a temperature of from about 150° C. up to the lower temperature of:
   (a) just below the melting or volatilization temperature of said particulate iodide compound reactant (which ever is lower); or
   (b) just below the volatilization point of a second reaction product formed when said mercuric compound reacts with said iodide compound to form said mercuric iodide;
   whereby said mercuric iodide reaction product will not be contaminated by volatilization of either said particulate iodide compound or said second reaction product.

3. The process of claim 1 wherein said particulate bed of iodide compound reactant is heated to a temperature of from about 150° C. up to about 700° C.

4. The process of claim 1 wherein said particulate bed of iodide compound reactant is heated to a temperature of from about 200° C. up to about 600° C.

5. The process of claim 1 wherein said gaseous source of a mercuric compound reactant is heated to a temperature of from about 80° to about 150° C. prior to passing said gaseous source of a mercuric compound through said particulate bed of iodide compound reactant.

6. The process of claim 1 wherein the resulting mercuric iodide vapor reaction product is condensed by cooling the vapor in a condensation region maintained at a temperature of from about 25° C. up to about 75° C.

7. The process of claim 1 wherein the resulting mercuric iodide vapor reaction product is condensed by cooling the vapor in a condensation region maintained at a temperature of from about 30° C. up to about 60° C.

8. The process of claim 1 wherein said particulate iodide compound reactant has a particle size range of from 4 to about 300 mesh (Tyler).

9. The process of claim 1 wherein said gaseous mercuric compound reactant is in contact with said particulate iodide compound reactant for a period of time sufficient to provide a reaction time of from at least 1 second up to about 60 seconds.

10. The process of claim 1 wherein said gaseous mercuric compound reactant is in contact with said particulate iodide compound reactant for a period of time sufficient to provide a reaction time of at least 10 seconds.

11. The process of claim 1 wherein said gaseous mercuric compound reactant comprises a mercuric compound capable of reacting with said particulate iodide compound reactant at a temperature of from about 150° C. to about 700° C. to form a vapor of a mercuric iodide reaction product and a second reaction product which has a vapor pressure insufficient to permit said second reaction product to volatilize out of said bed of particulate iodide compound at the reaction temperature.

12. The process of claim 1 wherein said particulate iodide compound reactant comprises an iodide compound capable of reacting with said gaseous mercuric compound reactant at a temperature of from about 150° C. to about 700° C. to form a a vapor of a mercury iodide reaction product and a vapor pressure insufficient to permit said particulate iodide compound reactant to volatilize out of said bed.

13. The process of claim 1 wherein said gaseous mercuric compound reactant consists essentially of a mercuric halide other than mercuric iodide.

14. The process of claim 1 wherein said particulate iodide compound reactant is selected from the class consisting of one or more alkali metal iodides, one or more alkaline earth metal iodides, and mixtures of same.

15. A process for producing high purity mercuric iodide which comprises:
   (a) providing a gaseous source of a mercuric compound reactant other than mercuric iodide;
   (b) providing a particulate bed of an iodide compound reactant selected from the class consisting of one or more alkali metal iodides, one or more alkaline earth metal iodides, and mixtures of same;
   (c) heating said bed of particulate iodide compound reactant to a temperature of from about 150° C. up to about 700° C.;
   (d) passing said gaseous source of mercuric compound reactant through said bed at a rate sufficient, with respect to said bed volume, to permit a reaction time of from at least about 1 second to up to about 60 seconds for said mercury compound to react with said iodide compound to form a mercuric iodide reaction product; and
   (d) condensing the resultant mercuric iodide vapor reaction product from said particulate bed in a condensation region maintained at a temperature of from about 25° C. up to about 75° C.

16. The process of claim 15 wherein said bed of particulate iodide compound reactant is heated to a temperature of from about 200° C. up to about 600° C.

17. The process of claim 15 wherein said condensation region is maintained at a temperature of from about 30° C. up to about 60° C.

18. The process of claim 15 wherein said gaseous source of a mercuric compound reactant is heated to a temperature of from about 80° to about 150° C. prior to passing said gaseous source of a mercuric compound through said particulate bed of iodide compound reactant.

19. A process for producing high purity mercuric iodide which comprises:
    (a) providing a gaseous source of mercury halide reactant;
    (b) providing a particulate bed of a low vapor pressure alkali metal iodide compound reactant selected from the class consisting of lithium iodide, potassium iodide and sodium iodide;
    (c) heating said bed of particulate alkali metal iodide compound reactant to a temperature of from about 200° C. up to about 600° C.;
    (d) heating said gaseous source of mercuric compound to a temperature of from about 80° to about 150° C.;
    (e) passing said heated source of gaseous mercury compound reactant through said heated bed of particulate iodide compound reactant at a rate sufficient, with respect to said bed volume, to provide a reaction time of at least 10 seconds up to 60 seconds to cause said mercury compound to react with said iodide compound to form a mercuric iodide reaction product; and
    (f) condensing the resultant mercuric iodide vapor reaction product in a condensation region maintained at a temperature of from about 30° C. up to about 60° C.

20. A process for producing high purity mercuric iodide which comprises:
    (a) providing a gaseous source of a mercuric compound;
    (b) providing a particulate bed of an iodide compound maintained at a first temperature;
    (c) passing said gaseous source of said mercuric compound through said bed to cause said mercuric compound to react with said iodide compound to form a mercuric iodide vapor reaction product; and
    (d) condensing the resultant mercuric iodide vapor reaction product from said particulate bed in a condensation region spaced from said particulate bed and maintained at a second temperature lower than said first temperature.

21. A process for producing high purity mercuric iodide which comprises:
    (a) providing a gaseous source of a mercuric compound;
    (b) providing a particulate bed of an iodide compound heated to a temperature of from about 150° C. up to the lower temperature of:
        (i) just below the melting or volatilization temperature of said particulate iodide compound reactant (which ever is lower); or
        (ii) just below the volatilization point of a second reaction product formed when said mercuric compound reacts with said iodide compound to form said mercuric iodide;
    (c) passing said gaseous source of said mercuric compound through said heated bed to cause said mercuric compound to react with said iodide compound to form a mercuric iodide vapor reaction product; and
    (d) condensing the resultant mercuric iodide vapor reaction product from said heated particulate bed in a condensation region spaced from said particulate bed and maintained at a second temperature lower than said bed temperature.

22. A process for producing high purity mercuric iodide which comprises:
    (a) providing a gaseous source of a mercuric compound reactant consisting essentially of a mercuric halide other than mercuric iodide.
    (b) providing a particulate bed off an iodide compound;
    (c) passing said gaseous source of said mercuric compound through said bed to cause said mercuric compound to react with said iodide compound to form a gaseous mercuric iodide reaction product; and
    (d) condensing the resultant gaseous mercuric iodide reaction product from said particulate bed in a condensation region.

23. A process for producing high purity mercuric iodide which comprises:
    (a) providing a gaseous source of a mercuric compound;
    (b) providing a particulate bed of an iodide compound selected from the class consisting of one or more alkali metal iodides, one or more alkaline earth metal iodides, and mixtures of same;
    (c) passing said gaseous source of said mercuric compound through said bed to cause said mercuric compound to react with said iodide compound to form a gaseous mercuric iodide reaction product; and
    (d) condensing the resultant gaseous mercuric iodide reaction product from said particulate bed in a condensation region.

* * * * *